(12) United States Patent
Sainsaulieu et al.

(10) Patent No.: US 10,906,407 B2
(45) Date of Patent: Feb. 2, 2021

(54) COMPACT INVERTER AND MOTOR VEHICLE COMPRISING SUCH AN INVERTER

(71) Applicant: ACILTEK, Paris (FR)

(72) Inventors: Lionel Sainsaulieu, Paris (FR); Jacques Favre, Tarbes (FR); Corentin Rizet, Montailleur (FR); Mahmoud Ibrahim, Saint-Martin-d'Hères (FR)

(73) Assignee: ACILTEK, Paris (FR)

( * ) Notice: Subject to any disclaimer, the term of this patent is extended or adjusted under 35 U.S.C. 154(b) by 173 days.

(21) Appl. No.: 16/139,199

(22) Filed: Sep. 24, 2018

(65) Prior Publication Data

US 2019/0092175 A1  Mar. 28, 2019

(30) Foreign Application Priority Data

Sep. 28, 2017 (FR) ...................................... 17 59031

(51) Int. Cl.
*B60L 50/51* (2019.01)
*H05K 7/20* (2006.01)
(Continued)

(52) U.S. Cl.
CPC .............. *B60L 50/51* (2019.02); *H01L 23/36* (2013.01); *H01L 23/4006* (2013.01);
(Continued)

(58) Field of Classification Search
CPC .............. H05K 7/20945; H05K 7/208; H05K 7/20836; H05K 7/2089; H05K 7/20336;
(Continued)

(56) References Cited

U.S. PATENT DOCUMENTS

2011/0299265 A1* 12/2011 Nakatsu ............. H05K 7/20409
361/820
2015/0083505 A1* 3/2015 Pearce, Jr. .............. B60L 58/21
180/65.1

FOREIGN PATENT DOCUMENTS

EP  1956649 A2  8/2008
EP  2101402 A2  9/2009
(Continued)

OTHER PUBLICATIONS

Search Report for French Application No. FR 1759031 dated Jun. 12, 2018.
(Continued)

*Primary Examiner* — Arnold M Kinkead
(74) *Attorney, Agent, or Firm* — Pearne & Gordon LLP

(57) ABSTRACT

This inverter, for electrical connection to a DC voltage source to supply an electric charge with three-phase current, includes a capacitive filter and a switching cell including, for each phase, a switching mode power supply circuit formed by two sets of controlled switches. Each set of controlled switches supplies a separate terminal of the switching cell, which also includes a sealed housing containing the switching mode power supply circuits. The housing is provided, on two opposite surfaces, with heat exchange means with a heat transfer fluid. A distributor is mounted, upstream from the housing, in a heat transfer fluid circulation circuit, to steer the heat transfer fluid toward the two opposite surfaces of the housing. The capacitive filter is cooled using at least one heat pipe. Part of this heat pipe, where the condensation of a fluid contained in the heat pipe occurs, is in thermal contact with the distributor.

19 Claims, 4 Drawing Sheets

(51) Int. Cl.
*H02M 7/537* (2006.01)
*H02M 7/00* (2006.01)
*H01L 23/40* (2006.01)
*H01L 23/427* (2006.01)
*H01L 25/07* (2006.01)
*H01L 23/36* (2006.01)

(52) U.S. Cl.
CPC .......... *H01L 23/427* (2013.01); *H01L 25/072* (2013.01); *H02M 7/003* (2013.01); *H02M 7/537* (2013.01); *H05K 7/20* (2013.01); *H05K 7/208* (2013.01); *H05K 7/2089* (2013.01); *H05K 7/20336* (2013.01); *H05K 7/20927* (2013.01); *H05K 7/20936* (2013.01); *H05K 7/20945* (2013.01); *B60L 2210/42* (2013.01); *B60L 2210/44* (2013.01); *Y02T 10/70* (2013.01)

(58) Field of Classification Search
CPC .. H05K 7/20; H05K 7/20936; H05K 7/20927; H01L 23/36; H01L 23/427; H01L 23/4006; H01L 25/072; B60K 11/00; B60K 11/04; H02M 7/537; H02M 7/003; B60L 50/51; B60L 2210/44; B60L 2210/42; Y02T 10/70
USPC ....... 307/10.1; 361/820, 689, 699, 704, 717, 361/679.53, 679.54; 257/712
See application file for complete search history.

(56) References Cited

FOREIGN PATENT DOCUMENTS

| | | |
|---|---|---|
| EP | 2323469 A1 | 5/2011 |
| EP | 2741412 A1 | 6/2014 |

OTHER PUBLICATIONS

Xiaofeng Lyu et al.; "DC-Link RMS Current Reduction by Increasing Paralleled Three-Phase Inverter Module Number for Segmented Traction Drive", IEEE Journal of Emerging and Selected Topics in Power Electronics, Mar. 2017, pp. 171-181, vol. 5, No. 1.

* cited by examiner

COMPACT INVERTER AND MOTOR VEHICLE COMPRISING SUCH AN INVERTER

The present invention relates to an inverter intended to supply an electric charge with three-phase current, from a DC current.

The field of the invention is more particularly that of hybrid or electric vehicles in which the energy is stored in a storage battery in order to power a traction motor operating with AC current.

For this type of application, it is necessary to convert the DC current leaving the storage battery into a three-phase AC current, for which an inverter is used. In general, such an inverter includes a switching cell that includes switching mode power supply circuits, this switching cell being controlled by a control circuit. Traditionally, the switching cell includes H half-bridges, each half-bridge being made up of two switches. The switching cells are relatively bulky and equipped with cooling radiators on only one side. These switching cells therefore tend to radiate heat on their side with no radiator, toward the electronic control card(s). Since the cooling of the electronic components of the switching cell is relatively limited, the dimensions of these components must be increased, starting from the hypothesis that the larger their surface is, the larger the contact surface with the radiator is and the better the discharge of the heat is. This tends to increase the dimensions of a switching cell, therefore the dimensions of an inverter included by such a cell. Other switching cells offer double-sided cooling, but this is often not optimal, and again, the dimensions of the components must be increased in order to increase the contact surface with the radiator.

Moreover, an inverter generally includes a capacitive filter including one or several capacitors arranged in parallel with the switching cell, between the input terminals of the inverter, in order to filter the voltage oscillations. The capacitor(s) of such a capacitive filter are sized more particularly taking account of the root mean square (RMS) of the line currents leaving the inverter. For example, for an inverter that switches line currents of 500 amperes (A) RMS, the capacitor must be able to allow currents of 65% of this value, or 325 A RMS, to pass. As a result, the capacitors of the capacitive filter are bulky.

For all of these reasons, an inverter that makes it possible to switch line currents of 500 A RMS generally takes up a volume of between 6 and 8 liters.

Yet space is limited in a motor vehicle, particularly in the engine compartment of a hybrid vehicle.

Furthermore, it is known in the literature, in particular in the article by LYU et al. titled "*DC-Link RMS Current Reduction by Increasing Parallel Three-Phase Inverter Module Number for Segmented Traction drive*" in IEEE JOURNAL OF EMERGING AND SELECTED TOPICS IN POWER ELECTRONICS, volume 5, number 1, March 2017, to make the switching cell of an inverter by interlacing, for each phase, two sets of controlled switches, connected in parallel across the two input terminals of the inverter and which make it possible to deliver two AC currents in parallel, on each phase of a motor.

Furthermore, US-A-2006/0138993 discloses an inverter whereof the switching cell includes interleaved sets of switches that make it possible either to power two motors in parallel, or to power a motor with the possibility of running it in two opposite directions. US-A-2006/0138993 does not concern itself with the size of the inverter.

Lastly, it is known from EP-A-2010402 to produce a heat transfer fluid circulation pipe in the thickness of a semiconductor module including, inter alia, a capacitor, within an inverter.

The present invention aims to improve the compactness of the known inverters by proposing a new inverter structure in which the sizing of the electrical components is improved, owing to the structure of the switching cell, which makes it possible to decrease the volume of the capacitive filter, and in which the cooling of the parts of the inverter that tend to heat up is done particularly effectively, which again makes it possible to decrease the volume of the capacitive filter.

To that end, the invention relates to an inverter intended to be electrically connected to a DC voltage source in order to supply an electric charge with three-phase current, this inverter including a switching cell that in turn includes, for each phase of the current, a switching mode power supply circuit formed by two sets of controlled switches, each set of controlled switches supplying a separate terminal of the switching cell, while this switching cell includes a sealed housing containing the switching mode power supply circuits. This inverter also includes a capacitive filter. According to the invention, the housing is provided, on two opposite surfaces, with heat exchange means with a heat transfer fluid. A distributor is mounted, upstream from the housing, in a heat transfer fluid circulation circuit, to steer the heat transfer fluid toward the two opposite surfaces of the housing. Furthermore, the capacitive filter is cooled using at least one heat pipe, while part of this heat pipe, where the condensation of a fluid contained in the heat pipe occurs, is in thermal contact with the distributor.

Owing to the invention, the structure of the switching cell, with two interleaved sets of controlled switches for each phase, limits the root mean square of the output current of the switching cell, which makes it possible to use, for the capacitive filter, one or several less bulky capacitors. Since the housing of the switching cell may be cooled on both of its opposite surfaces, owing to the heat exchange means, the cooling of this switching cell is more effective and it does not require large silicon surfaces to dissipate the heat. The use of one or more heat pipes allows particularly reliable and effective cooling of the capacitive filter, taking advantage of the fact that, at the input of the inverter, the heat transfer fluid has a relatively low temperature, which allows effective condensing of the fluid contained in this heat pipe. For all of these reasons combined, the inverter of the invention has an optimized electrical and thermal operation, which makes it possible to include it in a substantially smaller volume than the known equipment, this volume being smaller than three liters, in practice around two liters, for an inverter delivering DC line currents of 600 A RMS.

According to advantageous but optional aspects of the invention, such an inverter may incorporate one or more of the following features, considered in any technically allowable combination:

The capacitive filter is cooled by several heat pumps that extend in parallel between the capacitive filter and the distributor.

The part of each heat pump in thermal contact with the distributor is its end portion opposite the capacitive filter.

The part of each heat pump in thermal contact with the distributor is glued or welded on an outer surface of the distributor.

The switching cell is divided into three modules that each include two input terminals, two output terminals, two sets of switches, mounted in parallel between the two input terminals and each connected to an output terminal and a part of the housing that includes the two sets of switches.

The housing defines a heat transfer fluid circulation channel on each of its opposite surfaces.

Each part of the housing defines a part of each of the heat transfer fluid circulation channels and these pipe parts are aligned and in fluid communication when the switching cell is made up of the assembly of the three modules.

The capacitive filter includes at least one capacitor connected to the switching cell via a busbar, at least one heat pipe is in thermal contact directly with the capacitive filter or indirectly, i.e., in contact with a plate or an element of the busbar, in turn in contact with the capacitive filter, and this heat pipe is also in contact with the distributor.

The capacitive filter has a capacity supporting a supply voltage between 300 V and 950 V, the switching cell is able to supply each phase of the electric charge with two AC electric currents, the intensity of which is comprised between 100 and 500 A RMS, the inverter delivers cumulative line currents of 600 A RMS and the total volume of the inverter is less than or equal to 8 liters, preferably 6 liters, more preferably 3 liters, still more preferably 2 liters.

According to another aspect, the invention relates to a motor vehicle including a storage battery, an electric traction motor and an inverter for supplying this traction motor with three-phase current, from a DC current delivered by the storage battery. According to the invention, the inverter is as mentioned above.

Such a motor vehicle is easier to design and maintain, given the relatively small size of the inverter.

The invention will be better understood, and other advantages thereof will appear more clearly, in light of the following description of one embodiment of an inverter and a motor vehicle according to its principle, provided solely as an example and done in reference to the appended drawings, in which.

Figure 1:
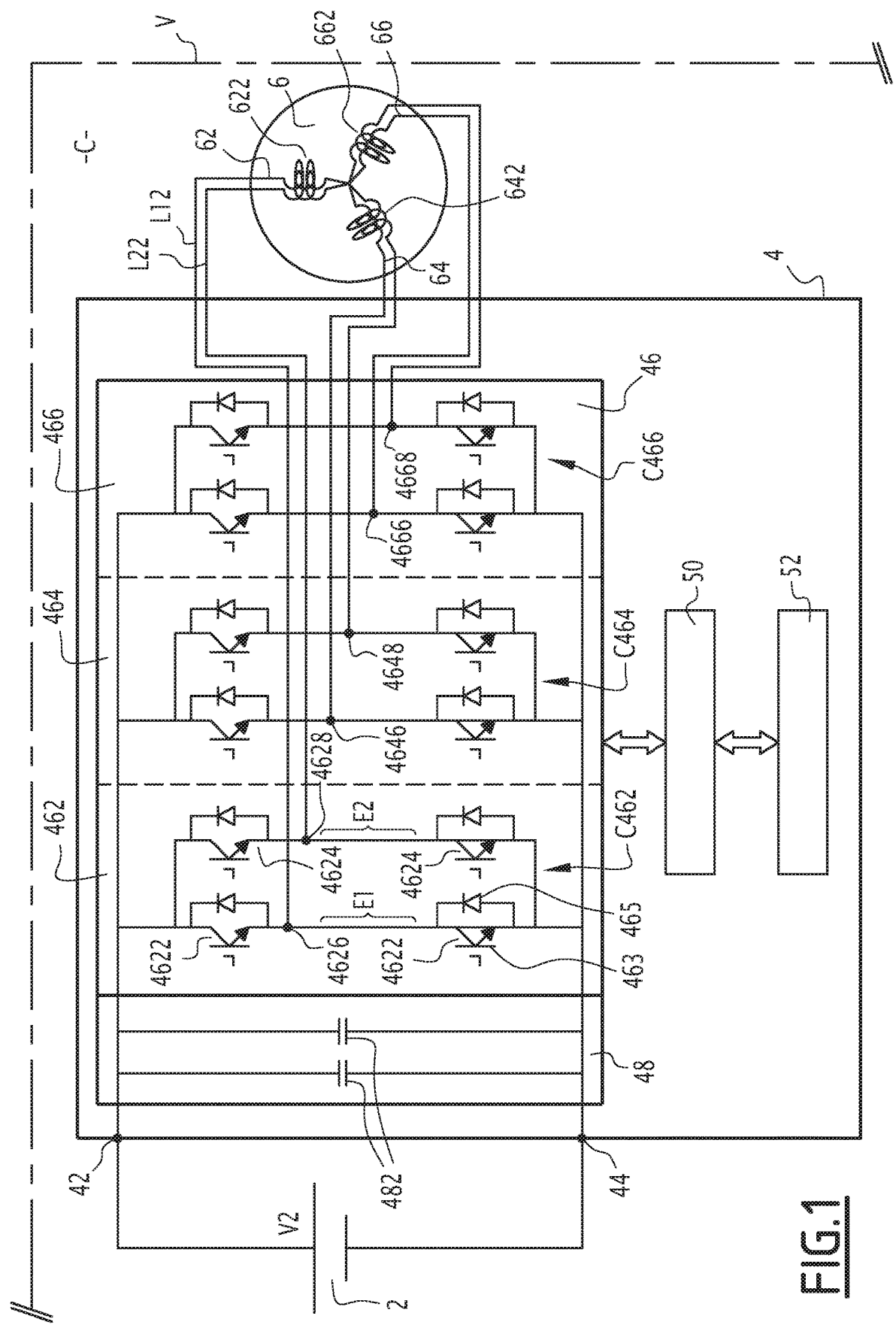
FIG. 1 is a schematic electrical illustration of a motor vehicle part according to the invention, incorporating an inverter according to the invention.

In FIG. 1, the electric traction chain C of a hybrid motor vehicle V is partially shown. This traction chain C includes a storage battery 2, an inverter 4 and a three-phase traction motor 6.

The storage battery 2 delivers a DC voltage V2, between 300 and 950 V, for example equal to 450 V. The battery 2 is connected over two input terminals 42 and 44 of the inverter 4.

This inverter 4 includes a switching cell 46 and a capacitive filter 48, both connected in parallel across the terminals 42 and 44.

The inverter 4 also includes a command card 50 and a control card 52. In practice, these cards 50 and 52 may be combined on a single physical card.

The switching cell 46 is formed by three identical modules 462, 464 and 466 respectively provided to supply the first phase 62, the second phase 64 and the third phase 66 of the traction motor 6. In FIG. 1, the modules 462, 464 and 466 are delimited relative to one another by vertical dotted lines.

Each module 462, 464 or 466 includes a switching mode power supply circuit formed by two sets of switches arranged in parallel between the terminals 42 and 44. For example, the module 462 includes a first circuit C462 made up of a first set E1 of two switches 4622 and a second set E2 of two switches 4624. All of the switches of the switching cell 46 are identical and include an insulated gate bipolar transistor (IGBT) 463, as well as a flyback diode 465.

In an alternative that is not shown, it is also possible to design this switching cell from MOS (Metal Oxide Semiconductor) components, such as Silicon Carbide (SiC) or Gallium Nitride (GaN). In these cases, the flyback diode is not necessary.

A first output terminal 4626 of the module 462 is electrically connected between the two switches 4622 of the set E1. A second output terminal 4628 of the module 462 is electrically connected between the switches 4624 of the set E2. Two electrical lines L12 and L22, advantageously formed by conductive cables, respectively connect the terminals 4626 and 4628 to a winding 622 of the first phase 62 of the traction motor 6.

Likewise, first and second sets of controlled switches, not referenced but visible in FIG. 1, are formed in the modules 464 and 466, and their respective output terminals 4646, 4648, 4666 and 4668 are respectively supplied by circuits C464 and C466 and connected to the windings 642 and 662 of the second and third phases 64 and 66 of the motor 6.

In light of the connection mode of the switches 4622, 4624 and the like of the switching cell 46, the output current traveling through the lines L12, L22 and the like has a RMS intensity equal to about half the RMS intensity that a current would have produced by modules including a single set of switches, for the same traction motor 6.

The command card 50 makes it possible to switch the transistors 463 according to a predetermined sequence and the control card 52 controls the set. For the clarity of the drawing, these cards 50 and 52 are not shown in FIG. 3.

Taking the example of a traction motor 6 having to be powered with a line current of 600 A RMS, the line currents traveling over each of the lines L12, L22 and the like have an intensity of 300 A RMS.

In the example of the figures, the inverter may be configured so that each terminal 4226, 4628, 4646, 4648, 4666 and 4668 delivers a phase current having an intensity comprised between 100 and 500 A RMS.

The inverter 4 delivers, on each phase of the traction motor 6, a cumulative current whose intensity is the sum of the phase currents derived from the terminals 4226 and 4628 for the phase 62, 4646 and 4648 for the phase 64, and 4666 and 4668 for the phase 66. Thus, the inverter 4 can supply the phases of the traction motor 6 with cumulative currents whose intensity is comprised between 200 and 1000 A RMS.

The capacitive filter 48 includes one or several capacitors 482. In the example, two capacitors are used. Using only these two, and in this example, these capacitors experience a current corresponding to about 32% of the RMS of the line currents, or 192 A RMS.

Figure 2:
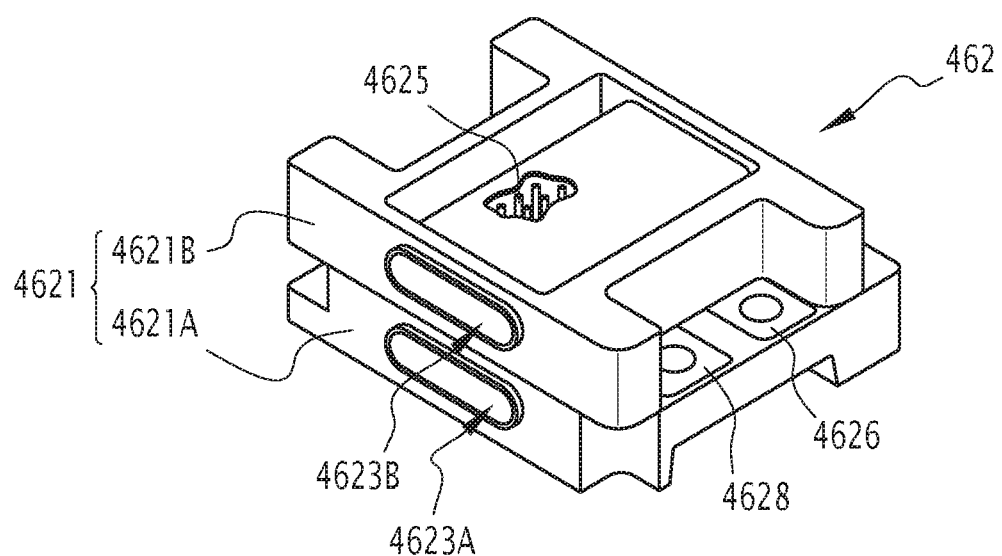
FIG. 2 is a perspective view, with partial cutaway, of a module belonging to a switching cell of the inverter of FIG. 1.
Figure 3:
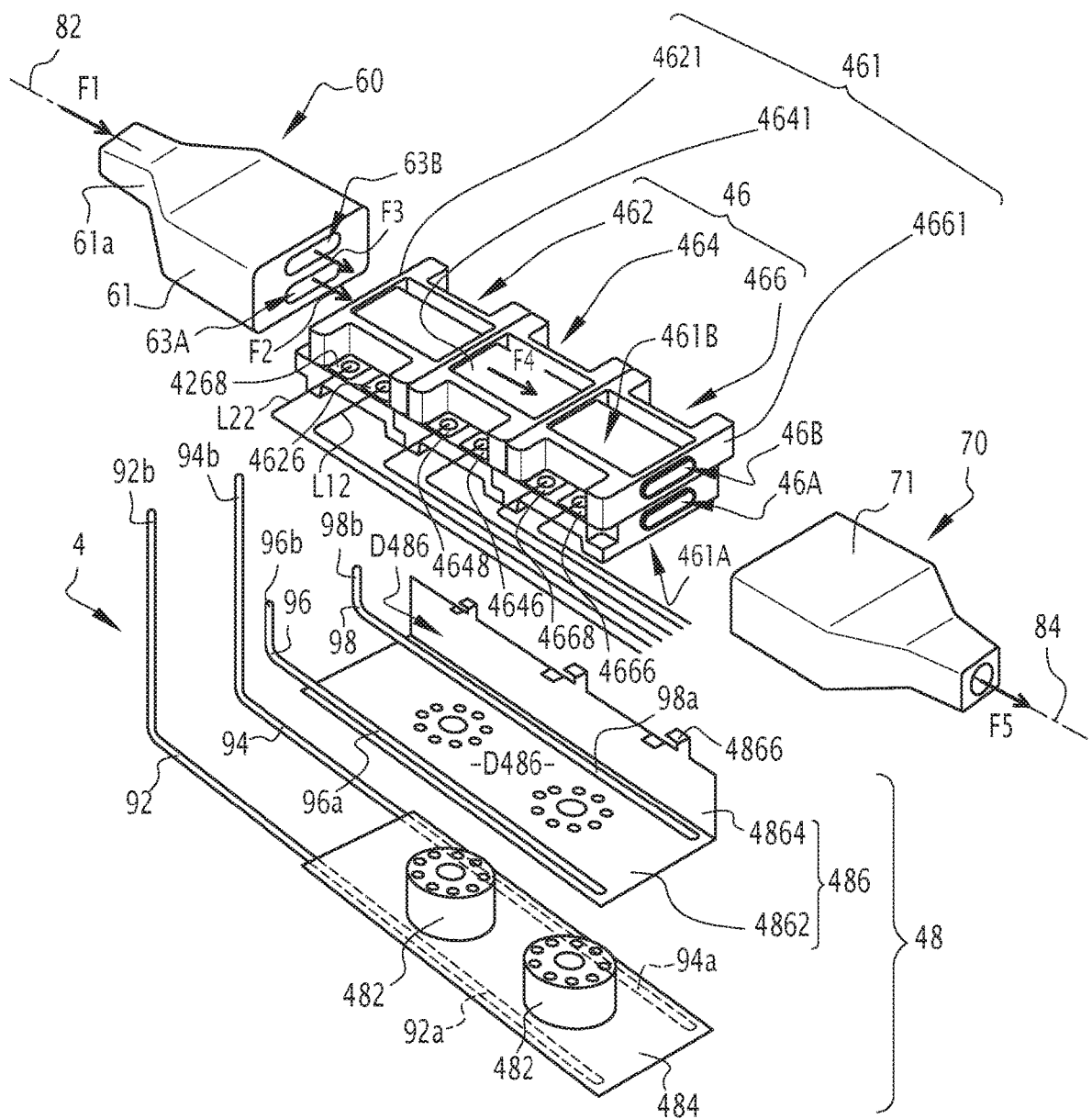
FIG. 3 is an exploded partial perspective view of the inverter of FIG. 1.
Figure 4:
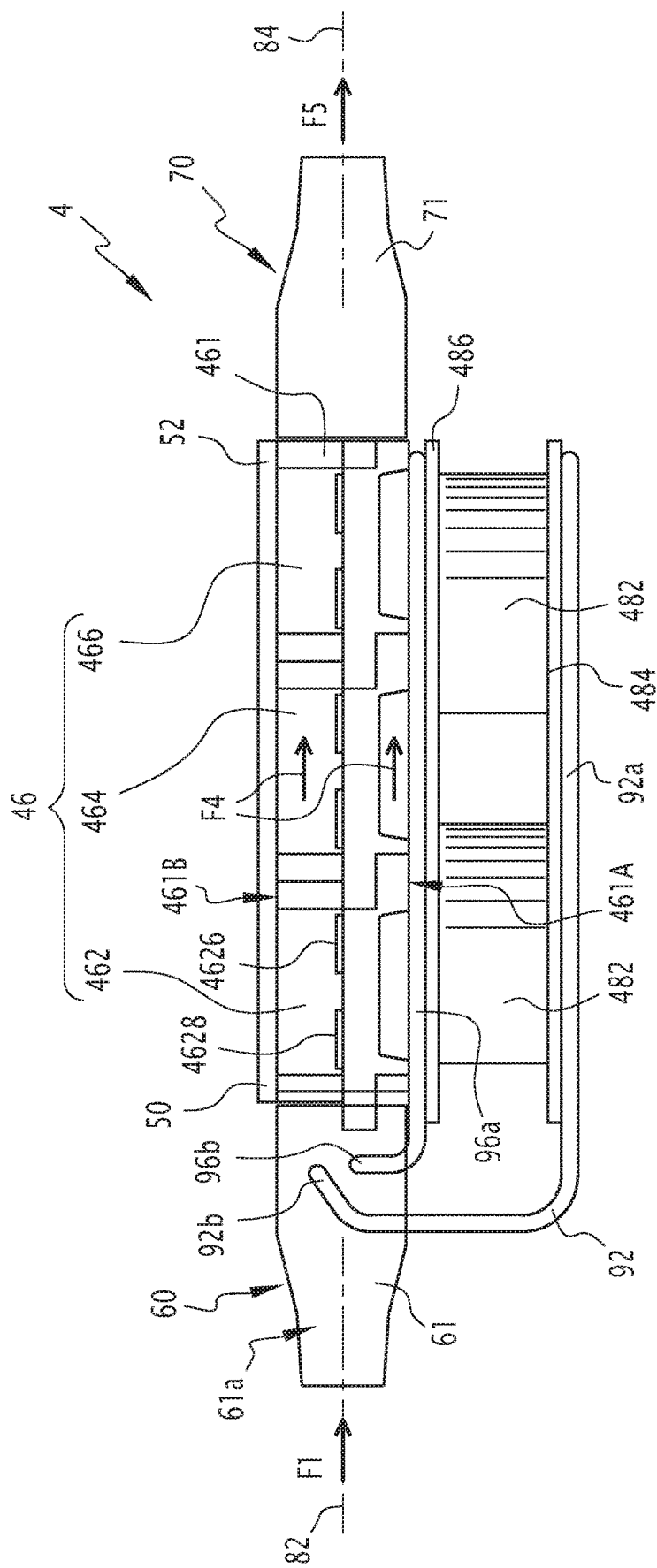
FIG. 4 is a side view of the inverter of FIG. 1.

The module 462 of the switching cell 46 is shown alone, in exterior view, in FIG. 2, and still in exterior view, within the switching cell 46 in FIGS. 3 and 4. This module includes a sealed unitary housing 4621 formed in two half-housings 4621A and 4621B arranged on either side of the electronic circuit plates that bear the circuit C462. These half-housings are assembled sealably and leave the terminals, not visible, exposed for connecting to the input terminals 42 and 44 of the inverter 4 and the output terminals 4626 and 4628.

The unitary housing 4621 is made from an electrically insulating material, for example Ultem (registered trademark) Polyetheride (PEI).

Each of the half-housings 4621A and 4621B defines a pipe 4623A, 4623B, respectively, making it possible to circulate a heat transfer fluid, such as water containing additives, or any other heat transfer fluid, in the immediate vicinity of the switches 4622 and 4624.

As shown by cutaway in FIG. 2, spurs 4625 are arranged in each of the pipes 4623A and 4623B, in order to facilitate the heat exchanges between the heat transfer fluid circulating in these pipes and the housing 4621. Alternatively, these spurs may be replaced by fins or other reliefs seeking to improve the heat transfer between the heat transfer fluid and the housing 4621. The spurs 4625 or the fins constitute a radiator within the module 462. For a good thermal output, this radiator is preferably welded to a support plate that supports the components of the circuit C462.

According to another alternative, these reliefs may be omitted.

The modules 464 and 466 also include unitary housings 4641 and 4661 that are identical to the housing 4621.

When the switching cell 46 is assembled, the unitary housings 4621, 4641 and 4661 are juxtaposed and immobilized relative to one another by mechanical means, not shown, such that these unitary housings 4621, 4641 and 4661 together make up a composite and sealed housing 461 of the switching cell 46 and their individual respective pipes are aligned and fluidly connected with one another. These pipes then constitute respective sets of two pipes 46A and 46B, which extend over the entire length of the switching cell 46.

Thus, the channels 46A and 46B and the reliefs that they contain optionally constitute heat exchange means distributed over two opposite surfaces of the housing 461, i.e., its lower surface 461A and its upper surface 461B in the illustration of FIGS. 3 and 4.

A distributor 60 and a collector 70 are respectively provided to supply the channels 46A and 46B with heat transfer fluid and to discharge the heat transfer fluid located in these channels.

Advantageously, the parts 60 and 70 are identical. However, this is not mandatory.

The distributor 60 includes a body 61 made from a thermally conductive material, for example metal, and preferably in this case aluminum or copper, which is in one piece and which makes it possible to distribute a flow of heat transfer fluid arriving in the direction of arrow F1 in FIG. 3, within a line 82 shown by an axis line, into two flows F2 and F3 respectively penetrating the channels 46A and 46B. As shown by FIG. 3, the side of the body 61 oriented toward the switching cells 46 is provided with two outlet orifices 63A and 63B intended to be aligned with the channels 46A and 46B.

This is not, however, mandatory, and a distributor 60 with a single outlet orifice covering the inlets of the channels 46A and 46B may also be considered.

The heat transfer fluid introduced into the channels 46A and 46B, from the distributor 60, flows along the length of the switching cell 46, in the direction of arrows F4 in FIGS. 3 and 4. From there, the heat transfer fluid leaves the series of housings 4621, 4641 and 4661, through the orifices of the channels 46A and 46B visible in FIG. 3, and enters the body 71 of the collector 70, from which it leaves in the form of a flow F5, within a discharge line 84, also shown by an axis line.

The lines 82 and 84 and the channels 46A and 46B belong to a circulation circuit of the heat transfer fluid, this circulation being shown by arrows F1 to F5.

The cooling of the switching cell 46 is particularly effective, since on the one hand, it takes place on the two opposite surfaces 461A and 461B of the housing 461, and on the other hand, the thermal resistance between the radiators and the circuits C462, C464 and C466 is minimal, since the radiators are welded to the support plates. The risks of heating of the components of the circuits C462, C464 and C466 are therefore limited, and it is not necessary to provide large supports. This bilateral cooling therefore participates in the compactness of the switching cell 46, and as a result, of the inverter 4.

The modular construction of the switching cell 46 causes gains in terms of productivity and maintenance. Indeed, in case of defects observed on one of the circuits C462, C464, C466, during the manufacturing of the cell 46, it suffices to replace the module for which this defect has been observed, without having to discard the entire cell 46. Likewise, during the lifetime of the cell 46, in case of malfunction, it is possible to change one of the modules 462, 464 and 466 without having to replace all of the modules.

Given that the switching cell 46 does not radiate heat toward the other elements of the inverter and as shown in FIG. 4, the electronic cards 50 and 52 may be arranged along one of the surfaces of the cell 46, i.e., the upper surface 461B of the housing 461, without requiring dedicated cooling.

The structure of the capacitive filter 48 is shown more clearly from FIGS. 3 and 4. This capacitive filter 48 includes, aside from the capacitors 482, two contact plates 484 and 486, respectively arranged below and above the capacitors 482 in the illustration of FIGS. 3 and 4.

The lower contact plate 484 contributes to the mechanical maintenance of these capacitors relative to the rest of the inverter 4. The contact plates 484 and 486 are mechanically connected to one another by mounting members, not shown, which allows them to grip the capacitors 482 to form a subassembly 48 that is easy to manipulate during the manufacturing of the inverter 4.

Alternatively, the lower contact plate 484 may be replaced by two half-plates, respectively located below the capacitors 482 and which are extended by fastening tabs on the contact plate 486.

The contact plate 486 is a multilayer structure that includes an insulating core and two conductive layers arranged on either side of this insulating core and making it possible to conduct an electric current.

The plate 486 includes a base 4862 intended to bear on and be connected with the capacitors 482, on their side opposite the plate 484, as well as a back 4864 that extends perpendicular to the base 4862 and that defines six tabs 4866 for connecting to the input terminals of the various modules 462, 464 and 466, i.e., two tabs per module. The upper contact plate 486 thus serves as a busbar powering the switching cell 46.

In one alternative that is not shown, it is the plate 484 that serves as a busbar.

In another alternative that is not shown, the capacitive filter 48 is placed next to the switching cell and not above or below.

In another alternative, the plates 484 and 486 may be omitted and the electrical connection between the capacitive filter and the switching cell is done by another means.

The contact plate 486 defines a dihedron D486 for receiving the switching cell 46 in the mounted configuration of the inverter 4.

Four heat pipes 92, 94, 96 and 98 are also part of the inverter 4. These heat pipes each assume the form of a hermetic enclosure that contains a fluid in liquid form in equilibrium with its gaseous phase, in the absence of another gas. At one end of a heat pipe, closest to an element to be cooled, the liquid heats up and vaporizes. The gas resulting from this vaporization then diffuses to the other end of the heat pipe, where it is cooled until it condenses to become liquid again, while ceding thermal energy.

In the example, the heat pipes 92 to 98 are made by copper enclosures, or any other metal conducting heat, that contain ammonia, or water, acetone, methanol, etc., in liquid and gaseous form.

The heat pipe 92 includes a segment 92a glued on the contact plate 484, in the example on the surface of this plate 484 opposite the capacitors 482. The heat pipe 92 also includes an end portion 92b glued on the outer surface 61a of the body 61.

In an alternative where the contact plate 484 is omitted, the heat pipe is placed in direct thermal contact with the capacitive filter 48.

Thus, the segment 92a of the heat pipe is in thermal contact with the capacitive filter 48 and its end position 92b is in thermal contact with the distributor 60.

Within the meaning of the present invention, two parts are in thermal contact when they are arranged so as to be able to exchange heat with one another. Several solutions may be used in order to provide weak enough thermal resistance between these two parts, including welding, gluing with thermally conductive glues, thermal greases, etc.

Thus, the product contained in the heat pipe 92 heats up in contact with the plate 484, within the segment 92a, to the point that it vaporizes, creating a temperature gradient in the heat pipe. This temperature gradient forces the vapor to move along the heat pipe until it reaches the relatively fresh zone in the end portion 92b in contact with the distributor 60, to the point that it condenses, thus releasing the heat extracted from the plate 484 on the distributor 60.

The heat pipes 94, 96 and 98 work in the same way, each with a segment 94a, 96a or 98a glued on one of the plates 484 or 486 and an end portion 94b, 96b or 98b glued on the outer surface 61a of the body 61.

The heat pipes 92, 94, 96 and 98 extend in parallel between the capacitive filter 48 and the distributor 60.

Alternatively, based on the nature of the material making up the heat pipes, the latter may be welded, on the one hand on the plates 484 and 486, on the other hand on the body 61, or even placed in thermal contact with these elements 484, 486 and 61 using another technique, in particular by jamming, brazing, crimping, gluing using a thermally conductive glue or thermal grease, etc.

This mounting allows effective cooling of the capacitive filter 48 and is even more effective when the end portions 92b, 94b, 96b and 98b are brought to relatively low temperatures. This may effectively be the case, since the body 61 of the distributor 60 is traveled by the heat transfer fluid that is not yet heated, since this heat transfer fluid has not yet traversed the channels 46A and 46B of the switching cell 46.

Since the current passing through the capacitive filter 48 is divided by two compared to a traditional inverter, the heating of this filter due to the equivalent serial resistance of any capacity is divided by four relative to this same traditional inverter. Thus, the quantity of heat to be extracted from the capacitive filter 48 is four times less than for a traditional inverter and the proposed device makes it possible to keep the temperature of the plates 484 and 486 at less than 5° C. for the temperature of the heat transfer fluid at the distributor 60.

In order to be able to place the inverter in ambient air up to 105° C. and to limit the thermal flow that must be discharged by the heat pipes, one may advantageously place the assembly formed by the capacitive filter 48 with its plates 484 and 486, as well as the heat pipes 92 to 98, in an enclosure made from a thermally insulating material having a thickness from 1 to 4 mm, for example.

In FIGS. 3 and 4, the segments 92a and 94a are shown below the lower contact plate 484, while the segments 96a and 98a are shown above the upper contact plate 486. Alternatively, other arrangements are possible.

The end portions 92b and the like may be distributed on either side of the distributor 60, for example with the end portions 92b and 96b on the portion of the surface 61a visible in FIG. 4 and the end portions 94b and 98b on the opposite portion. Other distributions may also be considered.

Owing to the combination of features mentioned above, the inverter 4 of the present invention may be particularly compact, as shown in FIG. 4, while having electrical properties compatible with its use for the supply of a traction motor of a motor vehicle. In the example, the inverter 4 may be supplied with a voltage V2 between 300 and 950 V and supply each phase 62, 64 and 66 of the traction motor 6 with two AC electric currents having an intensity of 300 A RMS and which accumulate to supply each phase of the motor with an intensity of 600 A RMS, while the inverter 4 has a total volume of less than or equal to 8 liters, preferably 6, still more preferably 3 liters. In practice, such an inverter may, owing to the invention, have a volume of 2 liters.

These dimensions will be reduced for line currents with a lower RMS intensity.

Alternatively, the number of heat pipes may be different from four, while remaining greater than or equal to one, and their distribution between the contact plates 484 and 486 may be different from that shown.

According to another alternative, the hot parts of the heat pipes may be directly in contact with the capacitors 482.

The inverter 4 may be used to control the three-phase current of an electric charge other than a traction motor, in particular a current generator.

The number of capacitors 482 of the capacitive filter 48 may be different from 2, in particular equal to 1.

The body 61 of the distributor 60 may be made from a metal other than aluminum, in particular copper, or even a nonmetal material, for example a plastic material conducting heat.

The embodiment and alternatives considered above may be combined with one another to generate new embodiments of the invention.

The invention claimed is:

1. An inverter intended to be electrically connected to a DC voltage source to supply an electric charge with three-phase current, this inverter including:
    a switching cell that in turn includes, for each phase of the current, a switching mode power supply circuit formed by two sets of controlled switches, each set of controlled switches supplying a separate terminal of the switching cell, while this switching cell includes a sealed housing containing the switching mode power supply circuits;
    a capacitive filter;
    wherein:

the housing is provided, on two opposite surfaces, with heat exchange means with a heat transfer fluid;
a distributor is mounted, upstream from the housing, in a heat transfer fluid circulation circuit, to steer the heat transfer fluid toward the two opposite surfaces of the housing;
the capacitive filter is cooled using at least one heat pipe;
part of this heat pipe, where the condensation of a fluid contained in the heat pipe occurs, is in thermal contact with the distributor; and
the capacitive filter is cooled by several heat pipes that extend in parallel between the capacitive filter and the distributor.

2. An inverter intended to be electrically connected to a DC voltage source to supply an electric charge with three-phase current, this inverter including:
a switching cell that in turn includes, for each phase of the current, a switching mode power supply circuit formed by two sets of controlled switches, each set of controlled switches supplying a separate terminal of the switching cell, while this switching cell includes a sealed housing containing the switching mode power supply circuits;
a capacitive filter;
wherein:
the housing is provided, on two opposite surfaces, with heat exchange means with a heat transfer fluid;
a distributor is mounted, upstream from the housing, in a heat transfer fluid circulation circuit, to steer the heat transfer fluid toward the two opposite surfaces of the housing;
the capacitive filter is cooled using at least one heat pipe;
part of this heat pipe, where the condensation of a fluid contained in the heat pipe occurs, is in thermal contact with the distributor,
the part of each heat pipe in thermal contact with the distributor is its end portion opposite the capacitive filter.

3. An inverter intended to be electrically connected to a DC voltage source to supply an electric charge with three-phase current, this inverter including:
a switching cell that in turn includes, for each phase of the current, a switching mode power supply circuit formed by two sets of controlled switches, each set of controlled switches supplying a separate terminal of the switching cell, while this switching cell includes a sealed housing containing the switching mode power supply circuits;
a capacitive filter;
wherein:
the housing is provided, on two opposite surfaces, with heat exchange means with a heat transfer fluid;
a distributor is mounted, upstream from the housing, in a heat transfer fluid circulation circuit, to steer the heat transfer fluid toward the two opposite surfaces of the housing;
the capacitive filter is cooled using at least one heat pipe;
part of this heat pipe, where the condensation of a fluid contained in the heat pipe occurs, is in thermal contact with the distributor,
the part of each heat pipe in thermal contact with the distributor is glued or welded on an outer surface of the distributor.

4. The inverter according to claim 1, wherein the switching cell is divided into three modules that each include:
two input terminals;
two output terminals;
two sets of switches, mounted in parallel between the two input terminals and each connected to an output terminal; and
a part of the housing that includes the two sets of switches.

5. The inverter according to claim 1, wherein the housing defines a heat transfer fluid circulation channel on each of its opposite surfaces.

6. The inverter according to claim 5, wherein the switching cell is divided into three modules that each include:
two input terminals;
two output terminals;
two sets of switches, mounted in parallel between the two input terminals and each connected to an output terminal; and
a part of the housing that includes the two sets of switches
and
wherein each part of the housing defines a part of each of the heat transfer fluid circulation channels and these pipe parts are aligned and in fluid communication when the switching cell is made up of the assembly of the three modules.

7. The inverter according to claim 1, wherein the capacitive filter includes at least one capacitor connected to the switching cell via a busbar, at least one heat pipe is in thermal contact directly with the capacitive filter or indirectly, i.e., in contact with a plate or an element of the busbar, in turn in contact with the capacitive filter, and this heat pipe is also in contact with the distributor.

8. The inverter according to claim 1, wherein the capacitive filter has a capacity supporting a supply voltage between 300 V and 950 V, in that the switching cell is able to supply each phase of the electric charge with two AC electric currents, in that the intensity of which is comprised between 100 and 500 A RMS, in that the inverter delivers cumulative line currents of 600 A RMS and in that the total volume of the inverter is less than or equal to 3 liters.

9. A motor vehicle including a storage battery, an electric traction motor and an inverter for supplying this traction motor with three-phase current, from a DC current delivered by the storage battery, wherein the inverter is according to claim 1.

10. The inverter according to claim 2, wherein the housing defines a heat transfer fluid circulation channel on each of its opposite surfaces.

11. The inverter according to claim 10, wherein the switching cell is divided into three modules that each include:
two input terminals;
two output terminals;
two sets of switches, mounted in parallel between the two input terminals and each connected to an output terminal; and
a part of the housing that includes the two sets of switches
and
wherein each part of the housing defines a part of each of the heat transfer fluid circulation channels and these pipe parts are aligned and in fluid communication when the switching cell is made up of the assembly of the three modules.

12. The inverter according to claim 2, wherein the capacitive filter includes at least one capacitor connected to the switching cell via a busbar, at least one heat pipe is in thermal contact directly with the capacitive filter or indirectly, i.e., in contact with a plate or an element of the busbar, in turn in contact with the capacitive filter, and this heat pipe is also in contact with the distributor.

13. The inverter according to claim 2, wherein the capacitive filter has a capacity supporting a supply voltage between 300 V and 950 V, in that the switching cell is able to supply each phase of the electric charge with two AC electric currents, in that the intensity of which is comprised between 100 and 500 A RMS, in that the inverter delivers cumulative line currents of 600 A RMS and in that the total volume of the inverter is less than or equal to 3 liters.

14. A motor vehicle including a storage battery, an electric traction motor and an inverter for supplying this traction motor with three-phase current, from a DC current delivered by the storage battery, wherein the inverter is according to claim 2.

15. The inverter according to claim 3, wherein the housing defines a heat transfer fluid circulation channel on each of its opposite surfaces.

16. The inverter according to claim 15, wherein the switching cell is divided into three modules that each include:
    two input terminals;
    two output terminals;
    two sets of switches, mounted in parallel between the two input terminals and each connected to an output terminal; and
    a part of the housing that includes the two sets of switches and
wherein each part of the housing defines a part of each of the heat transfer fluid circulation channels and these pipe parts are aligned and in fluid communication when the switching cell is made up of the assembly of the three modules.

17. The inverter according to claim 3, wherein the capacitive filter includes at least one capacitor connected to the switching cell via a busbar, at least one heat pipe is in thermal contact directly with the capacitive filter or indirectly, i.e., in contact with a plate or an element of the busbar, in turn in contact with the capacitive filter, and this heat pipe is also in contact with the distributor.

18. The inverter according to claim 3, wherein the capacitive filter has a capacity supporting a supply voltage between 300 V and 950 V, in that the switching cell is able to supply each phase of the electric charge with two AC electric currents, in that the intensity of which is comprised between 100 and 500 A RMS, in that the inverter delivers cumulative line currents of 600 A RMS and in that the total volume of the inverter is less than or equal to 3 liters.

19. A motor vehicle including a storage battery, an electric traction motor and an inverter for supplying this traction motor with three-phase current, from a DC current delivered by the storage battery, wherein the inverter is according to claim 3.

* * * * *